(12) United States Patent  
Ausschnitt et al.

(10) Patent No.: US 7,957,826 B2  
(45) Date of Patent: Jun. 7, 2011

(54) METHODS FOR NORMALIZING ERROR IN PHOTOLITHOGRAPHIC PROCESSES

(75) Inventors: Christopher P. Ausschnitt, Lexington, MA (US); Richard H. Broberg, Wellesley, MA (US); David A. Crow, Maple Grove, MN (US); William A. Muth, Lagrangeville, NY (US); Keith E. Roberts, Cambridge, MA (US)

(73) Assignee: International Business Machines Corporation, Armonk, NY (US)

( * ) Notice: Subject to any disclaimer, the term of this patent is extended or adjusted under 35 U.S.C. 154(b) by 891 days.

(21) Appl. No.: 11/842,515

(22) Filed: Aug. 21, 2007

(65) Prior Publication Data

US 2009/0053627 A1     Feb. 26, 2009

(51) Int. Cl.  
*G06F 19/00*     (2011.01)

(52) U.S. Cl. ........................................ 700/121; 700/110  
(58) Field of Classification Search ................. 700/120, 700/110, 121  
See application file for complete search history.

(56) References Cited

U.S. PATENT DOCUMENTS

| | | | |
|---|---|---|---|
| 6,700,950 B1 | 3/2004 | Pellegrini et al. | |
| 6,772,034 B1 * | 8/2004 | Shi et al. | 700/121 |
| 6,873,938 B1 * | 3/2005 | Paxton et al. | 702/188 |
| 7,225,047 B2 * | 5/2007 | Al-Bayati et al. | 700/121 |
| 2004/0181728 A1 * | 9/2004 | Pellegrini et al. | 714/742 |
| 2007/0022401 A1 * | 1/2007 | Wang | 716/21 |

* cited by examiner

*Primary Examiner* — Ryan A Jarrett  
(74) *Attorney, Agent, or Firm* — Cantor Colburn LLP; Ian MacKinnon

(57) ABSTRACT

A method for fabricating parts using a photolithography system, includes: performing a search of normalization data for an estimated dose operating point; and using the estimated dose operating point for fabrication of new parts.

4 Claims, 7 Drawing Sheets

METHODS FOR NORMALIZING ERROR IN PHOTOLITHOGRAPHIC PROCESSES

BACKGROUND OF THE INVENTION

1. Field of the Invention

The disclosed methods and systems relate generally to control techniques, and more particularly to techniques for normalizing error in semiconductor manufacturing processes.

2. Description of the Prior Art

Lithography is a process used in semiconductor manufacturing to transfer a circuit pattern from a photomask or reticle to a semiconductor wafer, or more specifically, to transfer the photomask pattern to a layer of resist that has been deposited on the wafer surface, where the resist is sensitive to irradiation. Different types of lithography may be based on the wavelength of the radiation used to expose the resist. For example, photolithography, otherwise known as optical lithography, uses ultraviolet (UV) radiation and a corresponding UV-sensitive resist. Ion beam lithography uses a resist sensitive to an ion beam, electron beam lithography uses a resist film sensitive to a scanning beam of electrons to deposit energy therein, and X-ray lithography uses a resist sensitive to X-rays.

Photolithography employs a photomask that may be understood to be a quartz plate that is transparent to UV radiation and includes a master copy of an integrated circuit that is often a microscopic integrated circuit. The photomask may be used to block resist exposure to select areas using chrome opaque areas.

A stepper is a resist exposure tool used in many photolithography systems to expose part of the wafer or resist in a given exposure. Systems employing a stepper may require a "step-and-repeat" process to expose the entire wafer as desired. A scanner is another type of resist exposure tool used in photolithography systems to expose part of the wafer or resist in a given exposure. Systems employing a scanner may require a "step-and-scan" process to expose the entire wafer as desired. In the aforementioned systems, overlay may be understood as the superposition of the pattern on the mask to a reference pattern previously created on the wafer surface. Related to overlay is alignment, which may be understood to be including positioning, or aligning, the mask or reticle relative to markers or targets on the wafer, prior to the exposure. Accordingly, to achieve proper exposure, overlay and alignment, among other parameters, should be properly controlled.

The smallest transverse dimension of a developed photoresist is commonly known as the critical dimension (CD). The critical dimension CD depends on the exposure or photoresist exposure dose, which is a measure of the light absorbed by the photoresist. Accordingly, a proper exposure dose for a given pattern may include different exposure times for different substrates based on the substrate optical properties. For example, an exposure dose may be based on the photoresist layer thickness which may change during manufacture to alter the surface's optical properties, thereby influencing the amount of light coupled into the photoresist. The CD of the developed photoresist thus determines the CD of the patterned material, and changes in a substrate's optical properties may result in unacceptable variations during the manufacturing process.

As the demand for smaller yet more complicated integrated circuits (ICs) increases, there is a similar demand for increased level of integration and reductions in the CD. Because lithography may occur repeatedly throughout IC fabrication, the CDs of the lines in the different patterns which are transferred should be precisely controlled throughout the fabrication process.

What are needed are techniques for further reducing the deviation of the critical dimension (CD) from the target value ($CD_T$) in a lithography process. Preferably, the techniques are amenable to integration with production systems.

BRIEF SUMMARY OF THE INVENTION

Disclosed is a method for fabricating parts using a photolithography system, that includes: performing a search of normalization data for an estimated dose operating point; and using the estimated dose operating point for fabrication of the parts.

Also disclosed is a method for controlling error in parts produced using a photolithography fabrication system, the parts including different critical dimension target values $CD_T$, the method including: computing a normalized critical dimension deviation ($\delta$) from a predetermined target value for the critical dimension, $CD_T$ and a measured critical dimension (CD); combining normalized critical dimension deviations ($\delta$) in a single dataset; computing a normalized dose error ($\epsilon$) for each normalized critical dimension deviation ($\delta$); and, providing a dose correction to minimize critical dimension deviations from the target value, $CD_T$, for subsequent fabrications of parts.

Further disclosed is a method for controlling fabrication error using a photolithography system for a plurality of parts, the method including: determining an error for each part in the plurality; normalizing the error; and plotting error associated with each part of the plurality on a single control chart.

Other systems, methods, and/or computer program products according to embodiments will be or become apparent to one with skill in the art upon review of the following drawings and detailed description. It is intended that all such additional systems, methods, and/or computer program products be included within this description, be within the scope of the present invention, and be protected by the accompanying claims.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

Figure 1:
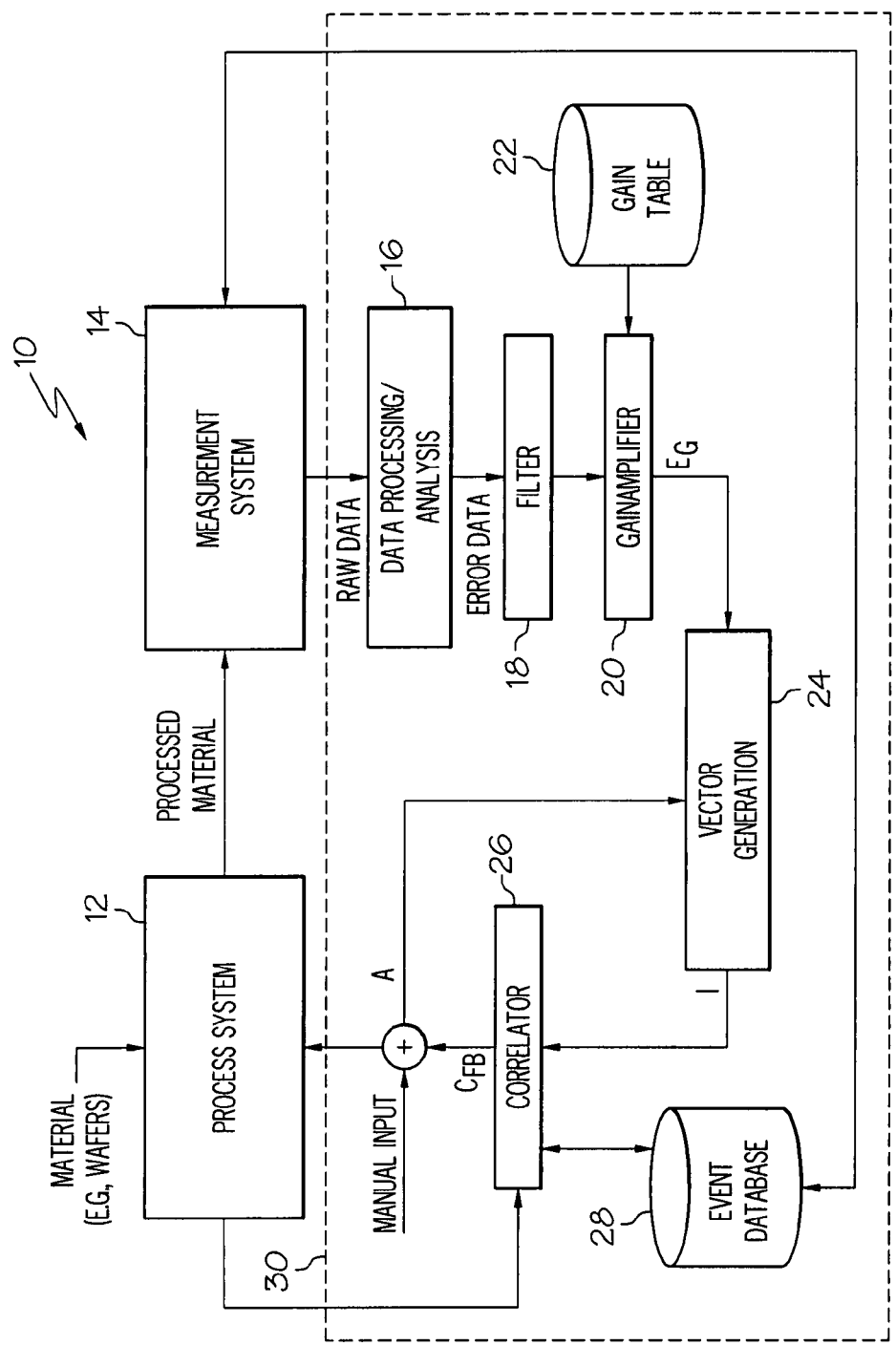
FIG. 1 illustrates a prior art control system using feedback.

The detailed description explains the preferred embodiments of the invention, together with advantages and features, by way of example with reference to the drawings.

DETAILED DESCRIPTION OF THE INVENTION

The teachings herein provide for controlling critical dimension (CD) by controlling exposure dose error in a process system (i.e., a photolithography fabrication system). As discussed herein, a fabrication system generally provides for fabrication of a plurality of parts. The parts may include components of semiconductor circuits formed in wafers. The fabrication is generally controlled by a fabrication control system which provides for, among other things, control of an optical lithography system used to fabricate the parts. As discussed above, the smallest transverse dimension of a developed photoresist is commonly known as the critical dimension (CD). The critical dimension CD depends on various factors, such as exposure of the photoresist to lithography light.

The teachings herein provide for measuring a measured exposure dose error ("dose error") based on an output(s) of the process system, normalizing the measured dose error based on a target exposure dose ("target dose"), and, providing an exposure dose to the process system, where the exposure dose may be based on a normalized dose error(s) which may or may not include aforementioned measured dose error. The target dose may thus be associated with a process system characteristic(s) and/or at least one measurement system characteristic(s) that may include, for example, a photomask, an exposure tool, and/or a process level. The measured dose error may thus be provided to a database, table, etc., and otherwise stored and/or associated with a process system and/or measurement system characteristic such as a photomask, an exposure tool, and a process level. This database is generally referred to as a "normalization table."

The normalization table may be queried to provide a target dose for normalizing measured dose errors, to provide a target dose for normalizing actual doses from the process system, and to provide a target dose for converting a dose error to an exposure dose for input (e.g., control) to the process system. Normalization data provided by the normalization table generally represents the estimated dose operating point, and is indicated by the variable "D." The best known estimated dose operating point, D, is used to achieve a target CD. As disclosed herein, various inputs may provide the best known estimated dose operating point, D. Accordingly, in some embodiments, another variable may be suitably interchanged with the best known estimated dose operating point, D, as the two quantities are equivalent. For example, techniques are provided for developing the estimated dose operating point, D, in certain instances. That is, in some embodiments, one of a seed value or a previous vector value may be used. In these embodiments, such quantities may be likened to the best known estimated dose operating point, D.

The exposure dose provided to the process system may thus be based on a combination of normalized exposure dose errors, where such combination may include a weighted moving average of normalized exposure dose errors. The exposure dose may thus be based on such combination, which may be converted from a unitless (normalized) quantity to an exposure dose using a target exposure dose retrieved from the normalization table. The target exposure dose used to convert the normalized dose error may be the target exposure dose used to normalize the measured exposure dose error, or may be a different target exposure dose.

Accordingly, the methods include providing at least one of a database, memory and other resources (e.g., "normalization table") to associate a normalized exposure dose error with a target exposure dose, and to update a target exposure dose using such normalized exposure dose error.

The methods may include computing an exposure dose error by measuring a critical dimension (CD) based on an output of the process system. Accordingly, a CD error may be computed by comparing a measured CD with a target CD, where in one embodiment, the comparison may be a difference measure. Such CD error may be converted to an exposure dose error using a dose sensitivity, where such conversion may include a scaling.

The method also includes generating an ideal exposure dose error based on the normalized exposure dose error and an (actual) exposure dose previously provided to the process system, where the exposure dose provided to the process system may be based on such ideal exposure dose error(s). The exposure dose provided to the process system may be, for example, based on a combination of ideal exposure dose error(s), such as a weighted moving average of at least two ideal exposure dose errors.

Accordingly, the target exposure doses of the normalization table are at least one of learned over time (such as by implementation of Eq. (9) below), determined by a manually entered value (i.e., a seed value), determined from a focus and exposure matrix (FEM), and assumed by reference to a previous ideal vector. Accordingly, at least one of the database and the normalization table may an have access to learning modules, filters, averaging techniques, etc., to determine, compute, update, or otherwise provide updated target exposure doses and associate such updated target doses with a process system or measurement characteristic. The updated target exposure doses may be based one or more normalized exposure dose errors, which may be associated with the same process system and/or measurement system characteristic as the target exposure dose for which the normalized exposure dose error(s) is updating. The methods may thus include providing at least one or more of default and initial target exposure doses (referred to herein collectively as "default target doses") and associating such default target doses with one or more process system and/or measurement system characteristics, where such default target exposure doses may be updated based on the aforementioned filters, averaging techniques, and/or learning modules, using for example, normalized exposure dose errors, to provide an updated target exposure dose. The updated target exposure dose may thus be provided in response to a query of the normalization table.

Also disclosed are systems for controlling critical dimension (CD) in a process system, the system including a measurement system to provide at least one measurement associated with a process system error, and a control system to provide an exposure dose to the process system, where the exposure dose may be based on a normalized exposure dose error, where the normalized exposure dose error may be based on a target exposure dose associated with at least one of a process system characteristic and a measurement system characteristic. The system may also include a normalization table to associate the target exposure dose with at least one of a process system characteristic and a measurement system characteristic. Such characteristics may include, for example, at least one of a photomask, an exposure tool, and a process level.

The systems may include one or more processors with instructions to cause the processor to compute a critical dimension (CD) error based on an output of the process system. The CD error may be based on a comparison of a measured CD and a target CD, where the measured CD may be based on the output(s) of the process system. The control system may also include instructions to cause a processor to normalize a computed critical dimension (CD) error based on a target exposure dose, where the target exposure dose may be based on at least one of a manual entry, a normalized exposure dose error, and data based on a focus and exposure matrix (FEM). Accordingly, the disclosed systems include instructions to cause a processor to retrieve the target exposure dose based on a query of a normalization table, where the normalization table associates the target exposure dose with at least one of a process system characteristic and a measurement system characteristic.

The measurement system may be at least one of an exposure tool and a critical dimension measurement tool. The process system may include at least one of a lithography, a microlithography, a chemical mechanical polish (CMP), a diffusion, thin film, a metal deposition, an ion implantation, and an etching system.

The disclosed systems may include instructions to cause a processor to update a target exposure dose using at least one normalized exposure dose error, where the updated target exposure dose may be stored in the normalization table. The target dose may thus be updated using instructions that implement at least one of a learning module, a filter and an averaging module. The updated target dose may thus be used for future normalizations of CD error.

For the disclosed methods and systems, references to a "reticle" may include a mask and a photomask, and variations thereof. Further, references to a "database" may be understood to include memory that may be capable of associating memory elements.

In order to provide some perspective for the teachings herein, reference may be had to U.S. Pat. No. 6,700,950, "Methods and Systems for Controlling Critical Dimension (CD) Error," issued Mar. 2, 2004 to Pellegrini et al., the disclosure of which is incorporated herein by reference where such teachings are consistent with those provided herein.

FIG. 1 provides one illustrative depiction of a prior art control system 10 that may be associated with semiconductor manufacturing. In accordance with FIG. 1, materials such as semiconductor wafers may be input to a process system 12 and hence to a measurement system 14. The illustrated process system 12 may be, for example, a system that performs lithography, chemical mechanical polish (CMP), diffusion, thin film, metal deposition, ion implantation, etching, or another process system. The illustrated measurement system 14 may be, for example, a metrology system such as an exposure measurement system or tool, an overlay measurement tool, a critical dimension (CD) measurement tool, a thickness measurement tool, a film reflectivity measurement tool, or another measurement tool or system. Accordingly, for one such embodiment based on FIG. 1, semiconductor wafers may be presented to a photolithography system 12 and thereafter to at least one of an exposure measurement and a critical dimension measurement tool 14 that provides measurements based on the processed wafers.

As shown in FIG. 1, raw data from the prior art measurement system 14 may be provided for at least one of processing and analysis 16, where the raw data may include measurements from the measurement system 14, configuration data (e.g., component identifiers, system identifiers, etc.) based on at least one of the process system 12, the measurement system 14, and other data (e.g., date, time, etc.). For a system according to FIG. 1, a data processing/analysis module 16 may be based on the process system 12 such that the output of the data processing/analysis module 16 may be configured to provide data in a form that may be used by and/or is otherwise compatible with the process system 12. In some systems, for example, the data processing/analysis module 16 may include modules for modeling and/or otherwise estimating at least some components and/or processes of the process system 12. In an illustrative embodiment, such as where the process system 12 is a lithography system and the measurement system 14 is an exposure and critical dimension measurement system, the data processing/analysis module 16 may include, for example, least square regression models for components of the lithography system 12. One such component may at least one of measure and model, for example, critical dimension (CD).

The data processing/analysis module 16 may provide error signals and/or data as output. Accordingly, in an embodiment based on the aforementioned lithography system, the data processing/analysis module 16 may provide data that may include measured CD, for example, but may additionally and optionally include other data such as x-translation, y-translation, x-scaling, y-scaling, wafer rotation, grid non-orthogonality, reticle magnification, reticle rotation, and others.

Although the data processing/analysis module 16 is not limited to providing at least one of measurement and error data as output, such output may be referred to collectively as error data, where such error data may also include data based on the configuration of at least one of the process system 12, the measurement system 14 and other data. To facilitate an understanding of systems and methods according to FIG. 1, the error data may be understood in some embodiments to include an error vector that may have at least one row and at least one column, where the size of the error vector may be based on the process system 12 and/or the measurement system 14. For the purposes of discussion herein, one element of such an error vector may include an exposure dose error that may be computed, for example, according to Eq. (1):

$$\text{Dose Error} = (\text{Measured\_CD} - \text{Target\_CD})/(\text{DoseSensitivity}) \qquad \text{Eq. (1)}.$$

Systems and methods according to FIG. 1 may also include a filter 18 that may operate on data based on the data processing/analysis output, and filter such data based on fixed and/or variable criteria. A system administrator, user, or another may establish or otherwise provide the filter criteria. In one embodiment, the filter 18 is based on user-defined rules that qualify the filter input data to determine whether such filter input data should be employed for at least one of controlling and otherwise characterizing the process system 12. The filter 18 may be viewed as providing a condition for using the input data to characterize the process system 12. For example, the filter 18 may distinguish data based on a number of successfully measured raw data points provided by the measurement system 14, where the number may be user-specified in some embodiments. In one embodiment, if a specified number of successfully measured raw data points are not provided, the data may be distinguished as inappropriate for feedback to the process system 12 in accordance with a system based on FIG. 1. The filter 18 may route or otherwise distinguish or classify data based on data markers, flags, or other data that may indicate that the data input to the filter 18 may be ignored or may otherwise be inappropriate for feedback to the process system 12. In one example, the error data may be marked or otherwise designated as being associated with a special event. In some embodiments, the filter 18 may include validation rules that may be applied to the data input to the filter 18. In illustrative systems, the filter 18 includes statistical and other filtering techniques that may include, for example, classification techniques such as Bayesian classifiers and neural networks.

Systems and methods according to FIG. 1 may also include a gain amplifier 20, such as a variable gain amplifier. A gain table 22 may accordingly provide stored gain values that adjust data based on the filtered error vector to compensate for scaling, sign differences, and other process system 12 and/or measurement system 14 characteristics. A gain amplifier output, Eg, may be provided to a vector generation module 24 that may provide a difference between: (a) data representing actual control data (offsets, commands, etc.), A, provided to the process system 12; and, (b) the gain amplifier output, Eg. The difference vector I, may be understood to represent an actual control to the process system 12, less the errors generated by such control. Those of ordinary skill in the art will recognize that the delay in providing the actual control, A, and receiving the error vectors, Eg, may be on the order of seconds, minutes, hours, or days. The difference vector, I, may be computed as I=A−Eg.

Data based on the difference vector I may be provided to a correlator module 26 that identifies and processes data from events having similar process system 12 characteristics. For example, for a given process system 12, events having similar characteristics may include events that are processed using similar configurations of the process system 12 and/or measurement system 14. In an embodiment where the process system 12 may be a lithography system and the measurement system 14 may be at least one of a exposure and critical dimension measurement system. For example, characteristics may include a lithography system identifier, a reticle identifier, a routing identifier (e.g., material used in processing), an operation identifier (e.g., operation being performed), a process level identifier (e.g., stage of processing), an exposure tool identifier, and/or a part number. An event database 28 or other memory component may thus include historical measurement data that may be provided by the measurement process 14 and thereafter be accessed by or otherwise integrated with the correlator module 26 to allow a feedback control and/or command vector, $C_{FB}$, to be computed based on a historical evaluation of similar process system 12 and/or measurement system 14 configurations. In some embodiments, $C_{FB}$ may provide incremental control/commands to the process system 12, while in some embodiments, $C_{FB}$ may provide an absolute control/command to the process system 12. Those of ordinary skill in the art will recognize that in the illustrated embodiment, the dimension of $C_{FB}$ may be based on or be the same as Eg, as the commands provided by $C_{FB}$ may be associated with the process system components for which error data may be obtained.

In some embodiments, event database data may be associated and/or correlated to facilitate queries of the event database 28. In the illustrated system, the event database 28 may associate actual command data, A, and gain amplifier outputs, Eg, with "correlation keys" that represent process system characteristics, and may otherwise be understood to be query and/or index terms. Accordingly, as shown in FIG. 1, the correlator module 26 may provide a command vector, $C_{FB}$, to the process system 12, where $C_{FB}$ may be based on a query of the event database 28 and associated I vector data that may be based on the query. The event database query may otherwise be understood to be a "feedback request," and as provided herein, may be based on correlation keys or process system characteristics.

One of ordinary skill will recognize that the event database 28 may include actual command data A, and gain amplifier outputs Eg that may otherwise be understood as errors. Accordingly, an ideal vector, or difference vector, I, may be recreated from respective A and Eg data.

In one embodiment, the command vector, $C_{FB}$, is based on a weighted moving average of historical difference vectors (e.g., "I vectors") that may be further based on similar process system characteristics and included in the event database 28. The weighted moving average may also be based on a user-specified time-period that may specify a time over which the I vector data may be collected for incorporation into, for example, the weighted moving average. The weighted moving average may be based on fixed and/or variable weights that may be specified by a user, for example. In some embodiments, the command vector may be of the same dimension as the gain amplifier output, Eg, and may include similar vector elements. For example, in accordance with a process system 12 that includes a lithography system or tool, a command vector may include at least one control associated with at least one of an x-translation error, a y-translation error, an x-scaling error, a y-scaling error, a wafer rotation error, a non-orthogonality error, an asymmetric magnification error, an asymmetry rotation error, a reticle rotation error, a reticle magnification error, a critical dimension (CD), linewidth error or bias, an exposure dose error or bias, a reticle density, a mask density, a frame-to-frame alignment, a distance from optical center to frame center, an alignment mark line size, an alignment mark density, and an alignment mark duty cycle.

The illustrated event database 28 may employ a commercially available database (e.g., SQL, Informix, Oracle, Access, etc.) or another system for associating data and allowing such associated data to be queried and/or retrieved according to the methods and systems disclosed herein. In an embodiment where the process system 12 includes a lithography system, the event database 28 may be arranged to associate data based on, for example, process system characteristics and/or other correlation keys that may include a technology identifier (e.g., type of processor, operating system, etc.), a reticle identifier, a route identifier, an operation identifier, a process level identifier, an exposure tool identifier, and/or a part number.

The correlator module 26 may thus also include or otherwise provide for rules for querying the event database 28. In an embodiment, a user and/or system administrator may provide default query rules that may be modified using, for example, an interface such as a graphical user interface (GUI). For example, a user may provide the correlator module 26 with a hierarchy of query criteria and filter criteria such that one or more correlation keys or query criteria may be eliminated from the query or otherwise presented as a wildcard in the query if the filtered query results are not sufficient. Accordingly, query results may be filtered based on default and/or user-specified criteria that may include, for example, a minimum number of query results, a maximum number of query results, a time period within which the data may have been collected, and/or a type of weighting average to apply. In an embodiment, if the filtered query results are inadequate to allow for a computation of the control/command vector, $C_{FB}$, the disclosed methods and systems may allow for a wildcarding of system parameters based on a user's hierarchical wildcarding configuration. Such a system may thus perform several feedback requests or database queries and filterings before obtaining query results sufficient for computing $C_{FB}$.

In one example, a user may query the event database 28 based on process system characteristics that include a technology identifier (ID), a routing identifier (ID), a process level identifier (ID), an operation identifier (ID), a device (or part number) identifier (ID), a reticle identifier (ID), an exposure tool identifier (ID), and/or another process and/or measurement system characteristic. The query may further specify or it may otherwise be known that data satisfying such process system characteristics be within a time period in the last M weeks, and further, at least N data points be collected for a valid retrieval. Because the criteria for N data points within the past M weeks may not be satisfied in an initial query, the user may decide to wildcard, for example, the exposure tool ID criteria to potentially allow further data points (i.e., satisfying the query regarding process system characteristics other than exposure tool ID). If N data points with M weeks are not retrieved after querying without employing exposure tool ID, the user may specify that the next process system criteria to be eliminated from the query may be reticle ID. Those of ordinary skill in the art will recognize this example as providing an illustration of the aforementioned hierarchical wildcarding, where query terms and/or correlation keys may be specified as employing an exact match, a partial wildcard, or a complete wildcard (e.g., operating system not relevant). The user may establish a hierarchical rule for invoking the wildcards (e.g., in the example herein, exposure tool ID was ranked as the first parameter to wildcard, followed by reticle ID, etc.).

In some cases, the wildcarding process may not provide sufficient query results for allowing a computation of $C_{FB}$. In an embodiment, a user or another may be alerted or otherwise informed when $C_{FB}$ cannot be computed because of insufficient query results, and such condition may require a manual adjustment to a system according to FIG. 1.

As illustrated in FIG. 1, some embodiments may allow a user or another to provide a manual input (e.g., user-specified input) to override or otherwise compensate the command vector, $C_{FB}$. Accordingly, a system based on the illustrated control system 30 may include one or more processor-controlled devices that may interface to the process system 12 and the measurement system 14, where a user, system administrator, or another may access data at various stages of the control system 30 via a user interface (e.g., GUI, operating system prompt) and utilize one or more peripheral devices (e.g., memory, keyboard, stylus, speaker/voice, touchpad, etc.) to provide input or otherwise alter data at various stages of the control system 30. A user may also utilize tools that may be incorporated into or otherwise interface with the control system 30 to analyze or otherwise view data at various stages of the control system 30, where such analysis may be performed in real-time and/or off-line. Accordingly, changes to the components of such a control system 30 may be performed in real-time and/or off-line.

Those of ordinary skill in the art will recognize that in an example where the FIG. 1 process system 12 may be a lithographic system and the measurement system 14 may be an exposure measurement tool, the lithographic system 12 may be configured by a user to query for data from the correlator module 26 and/or event database 28 to provide an initial command vector, $C_{FB}$, where such query may also include or otherwise be based on process system characteristics, hierarchical rules, wildcarding, and other criteria. Based on the filtered query results, a $C_{FB}$ may be provided for an initial wafer. If a $C_{FB}$ cannot be computed based on a lack of filtered query results, systems and methods according to FIG. 1 may cause a "send-ahead" wafer to allow processing and measurements upon which control may be provided. Using send-ahead wafers and other such techniques may be costly and may adversely affect the throughput of the methods and systems. In order to reduce the occurrences of ineffective queries and hence "send-ahead" wafers, users may devise a query to obtain a desired number of query results to provide an initial $C_{FB}$, but such wildcarding techniques may cause incompatible data (e.g., based on different process system characteristics from that presently occurring in the process system 12) to be included in the $C_{FB}$ computation, and hence be ineffective in providing the desired control. For example, a user may wildcard reticle ID, thus allowing the query to combine (e.g., compute a weighted moving average) based on different reticle IDs. In this example, because different reticles have different reticle errors, such errors remain uncompensated, and hence may combine in undesirable manners to induce undesirable system performance, particularly when the process system 12 is presently utilizing or otherwise affected by a specific reticle.

The methods and systems of FIG. 1 relate to controlling CD error based on a control of dose error, which may be one control provided in the feedback command, $C_{FB}$. Those of ordinary skill thus recognize that CD error may be associated with exposure dose error, where exposure dose error may be computed based on Equation (1), and with relation thereto, a user or another may provide a Target CD, and the Measured CD may be provided by the raw data analysis 16. Accordingly, because the difference between Target and Measured CD has units of, for example, micrometers, and Dose Sensitivity has units of (micrometers/dose-unit), the exposure dose error component of $E_G$ may have units of dose-units. Similarly, the I, A, and $C_{FB}$ exposure dose error components also have units of dose-units. For a method and system according to FIG. 1, regardless of the system parameters (e.g., photomask ID, exposure tool ID, etc.), the exposure dose error component may have units of dose-units, and thus be combined (e.g., weighted moving average) without regard for differences in the system parameters.

Figure 2:
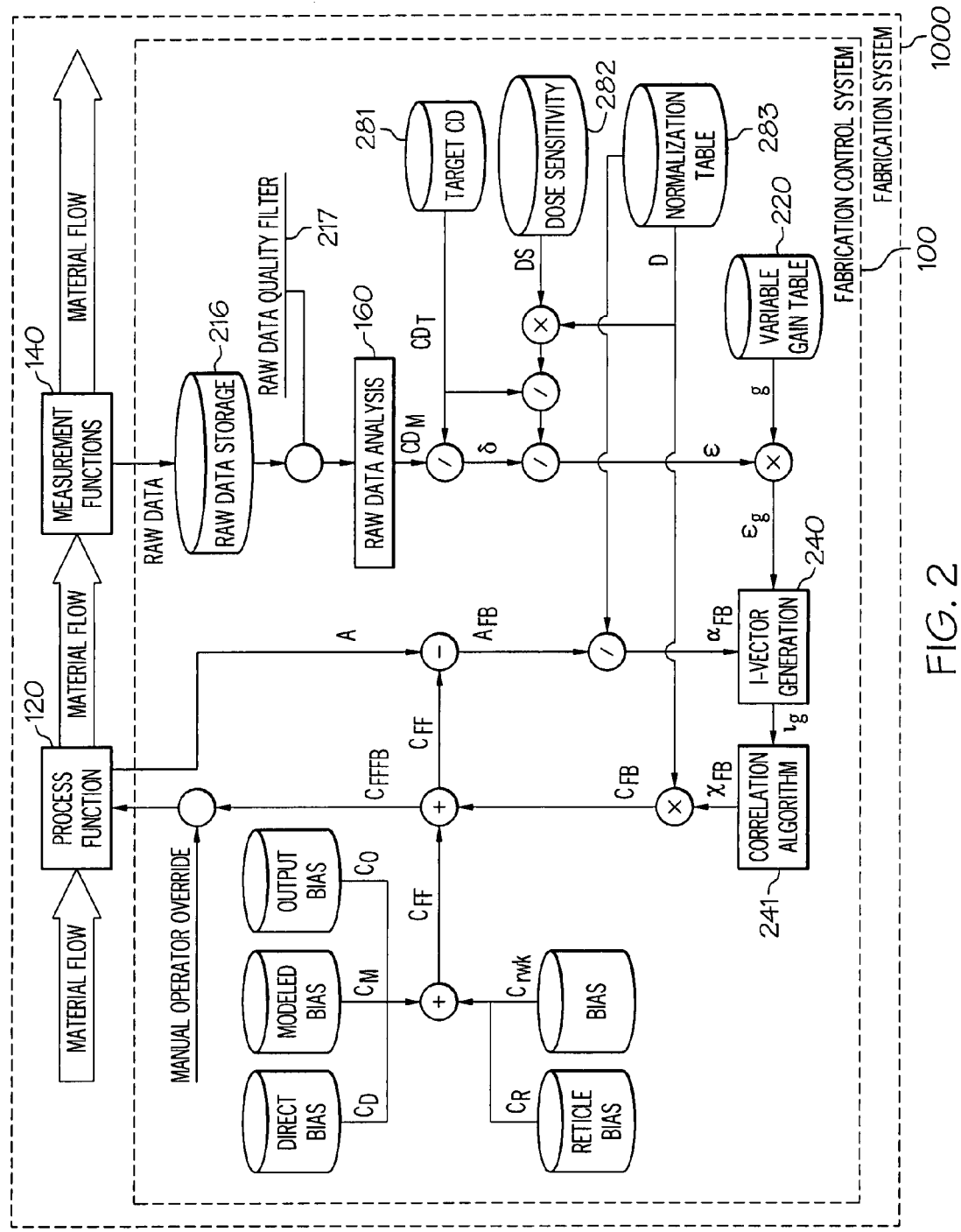
FIG. 2 illustrate aspects of critical dimension (CD) normalization in a production environment.

Now with regard to FIG. 2, aspects of an exemplary embodiment of a fabrication system 1000 are depicted. The fabrication system 1000 includes many components similar to those provided in the prior art. For example, materials such as semiconductor wafers may be input to a process system 120 and hence to a measurement system 140. The illustrated process system 120 may be, for example, a system that performs lithography, chemical mechanical polish (CMP), diffusion, thin film, metal deposition, ion implantation, etching, or another process system. The illustrated measurement system 140 may be, for example, a metrology system such as an exposure measurement system or tool, an overlay measurement tool, a critical dimension (CD) measurement tool, a thickness measurement tool, a film reflectivity measurement tool, or another measurement tool or system. Accordingly, for one such embodiment based on FIG. 2, semiconductor wafers may be presented to a photolithography system 120 and thereafter to at least one of an exposure measurement and a critical dimension measurement tool 140 that provides measurements based on the processed wafers.

Aspects of the fabrication system 1000 are controlled by a fabrication control system 100. The fabrication control system 100 includes components similar to those found in the prior art. For example, raw data is accepted and stored in a raw data storage 216. A raw data quality filter 217 may be employed to filter raw data fed to a data processing module 160. The data processing module 160 produces a value for the measured CD, $CD_M$. The target $CD_T$ may be provided by a table or other form of data stored in a target CD storage 281. From a combination of the measured CD, $CD_M$, and the target CD, $CD_T$, a normalized CD deviation, $\delta$, is computed. The normalized CD deviation, $\delta$, may be determined according to Eq. (2):

$$\delta=(CD_M/CD_T-1) \qquad \text{Eq.(2)},$$

where the normalized CD deviation, $\delta$, is unitless. In addition, dose sensitivity, DS, is taken into account. The dose sensitivity, DS, may by characterized by an expected CD change relative to a known change in dose. In one embodiment, after determination of the normalized CD deviation, $\delta$, normalized dose error, $\epsilon$, is determined. The normalized dose error, $\epsilon$, may be determined according to Eq. (3):

$$\epsilon=\delta/(D/CD_T*DS) \qquad \text{Eq.(3)},$$

where D represents the normalization value and normalized dose error, $\epsilon$, is also unitless. In this embodiment, the normalized dose error, $\epsilon$, is combined with variable gain, g, to provide gain modified normalized dose error, $\epsilon_g$. The gain modified normalized dose error, $\epsilon_g$, may be determined according to Eq. (4):

$$\epsilon_g \epsilon^T g \qquad \text{Eq.(4)},$$

where the gain modified normalized dose error, $\epsilon_g$, is also a unitless quantity. A normalized actual feedback dose, $\alpha_{FB}$, is computed. The normalized actual feedback dose, $\alpha_{FB}$, may be calculated according to Eq. (5):

$$\alpha_{FB} = ((A/D) - 1) \qquad \text{Eq.(5)},$$

where:
A represents actual dose; and
D represents the normalization value.

From the gain modified normalized dose error, $\epsilon_g$, and the normalized actual feedback dose, $\alpha_{FB}$, a gain modified normalized ideal vector, $\iota_g$, may be calculated. In this example, the gain modified normalized ideal vector, $\iota_g$, is determined according to Eq. (6):

$$\iota_g = (\alpha_{FB} - \epsilon_g) \qquad \text{Eq.(6)}.$$

The gain modified normalized ideal vector, $\iota_g$, is used as an input to a correlation algorithm 241 to provide a normalized feedback command, $\chi_{FB}$, which may be calculated according to Eq. (7):

$$\chi_{FB} = \left( \sum_{m=1}^{N} (W_{N-m} * \iota_{N-m}) \right) / N; \qquad \text{Eq. (7)}$$

where:
W represents a weight factor for each lot; and
N represents a number of lots.

The normalized feedback command, $\chi_{FB}$, is combined with the normalization value, D, to produce a feedback command, $C_{FB}$. Often times, a confusing aspect of normalization is the association of the normalization value, D, with historical data and the feedback request. The normalization table contains the normalization value, D, for every process stream or combination of process characteristics (e.g. technology, route, layer, tool, etc.). When historical data is normalized to produce the normalized error, the actual normalization value, D, (and subsequent ideal value) is individually selected. Selection may be based on process characteristics for each historical event. When the controller converts from a normalized feedback command to the feedback command (CFB) the normalization value, D, specific to the process characteristics of the feedback request is selected. This association is what allows the controller to combine historical data from different parts (process characteristics) to produce a feedback command. As an example, the combination may be determined by Eq. 8:

$$C_{FB} = D * (\chi_{FB} + 1) \qquad \text{Eq. (8)}.$$

The normalization value, D, is drawn from a normalization table 283. The normalization table 283 is described in more detail in FIG. 3. Various aspects of system bias are factored into the feedback command, $C_{FB}$, to provide a feedforward command, $C_{FF}$. Aspects of system bias include, for example, direct bias $C_D$, modeled bias $C_M$, output bias $C_O$, reticle bias $C_R$ and rework bias $C_{rwk}$. In some embodiments, the direct bias, $C_D$, allows the controller to accept a user-provided feedforward bias vector as part of the feedback request (e.g. previous layer overlay), the modeled bias, $C_M$, allows the controller to accept a user-provided measurement value as part of the feedback request for modeling within the controller based on a user defined linear model (e.g. film thickness), the output bias, $C_O$, allows the user to define a known feedforward bias in the Registry (e.g. tool PMs, engineering splits), while the rework output bias, $C_{rwk}$, allows the user to define a known feedforward bias in the Registry to account for changes induced by the rework process (e.g. dose changes). The result of the factoring is referred to as a feedforward-feedback command, $C_{FFFB}$. As a summary of these relationships and quantities, Tables I through IV are provided, where the information provided in the Tables may be seen to correlate to FIG. 2.

TABLE I

Inputs to Normalize the Dose (System Input)

| Quantity | Description | Exemplary Units |
|---|---|---|
| A | Actual Dose | dose unit |
| $C_{FF}$ | Feedforward Command, $\Sigma(C_R, C_D, C_M, (C_O \text{ or } C_{rwk}))$ | dose unit |
| $A_{FB}$ | Actual feedback dose A − $C_{FF}$ | dose unit |
| D | Normalization value | dose unit |

TABLE II

Inputs to Normalize the Error (System Output)

| Quantity | Description | Exemplary Units |
|---|---|---|
| $CD_T$ | Target CD, desired CD | μm |
| $CD_M$ | Measured CD | μm |
| DS | Dose sensitivity, $\Delta CD/\Delta$ dose | μm/dose unit |
| D | Normalization value | dose unit |
| g | Variable gain | unitless |

TABLE III

Convert Back to Dose Units

| Quantity | Description | Exemplary Units |
|---|---|---|
| $C_{FB}$ | Feedback command D * $(\chi_{FB}+1)$ | dose unit |
| $C_{FF}$ | Feedforward command, $\Sigma(C_R, C_D, C_M, (C_O \text{ or } C_{rwk}))$ | dose unit |
| $C_{FFFB}$ | Feedforward-Feedback command, $C_{FF} + C_{FB}$ | dose unit |

TABLE IV

Normalization Formulas

| Quantity | Description | Exemplary Units |
|---|---|---|
| δ | Normalized CD deviation, $(CD_M/CD_T)$ | unitless |
| $\epsilon$ | Normalized dose error, $(\delta/(D/CD_T * DS)$ | unitless |
| $\epsilon_g$ | Gain modified normalized dose error, $\epsilon^T g$ | unitless |
| $\alpha_{FB}$ | Normalized actual feedback dose, $((A/D) - 1)$ | unitless |
| $\iota_g$ | Gain modified normalized ideal vector, $(\alpha_{FB} - \epsilon_g)$ | unitless |
| $\chi_{FB}$ | Normalized feedback command, $(\Sigma_{m=1 \text{ to } N}(W_{N-m} * \iota_{N-m}))/N$ | unitless |

One skilled in the art will recognize that the normalization table 283 fulfills an important role in developing feedback. Accordingly, more detail regarding the normalization table 283 is provided in FIG. 3.

Figure 3:
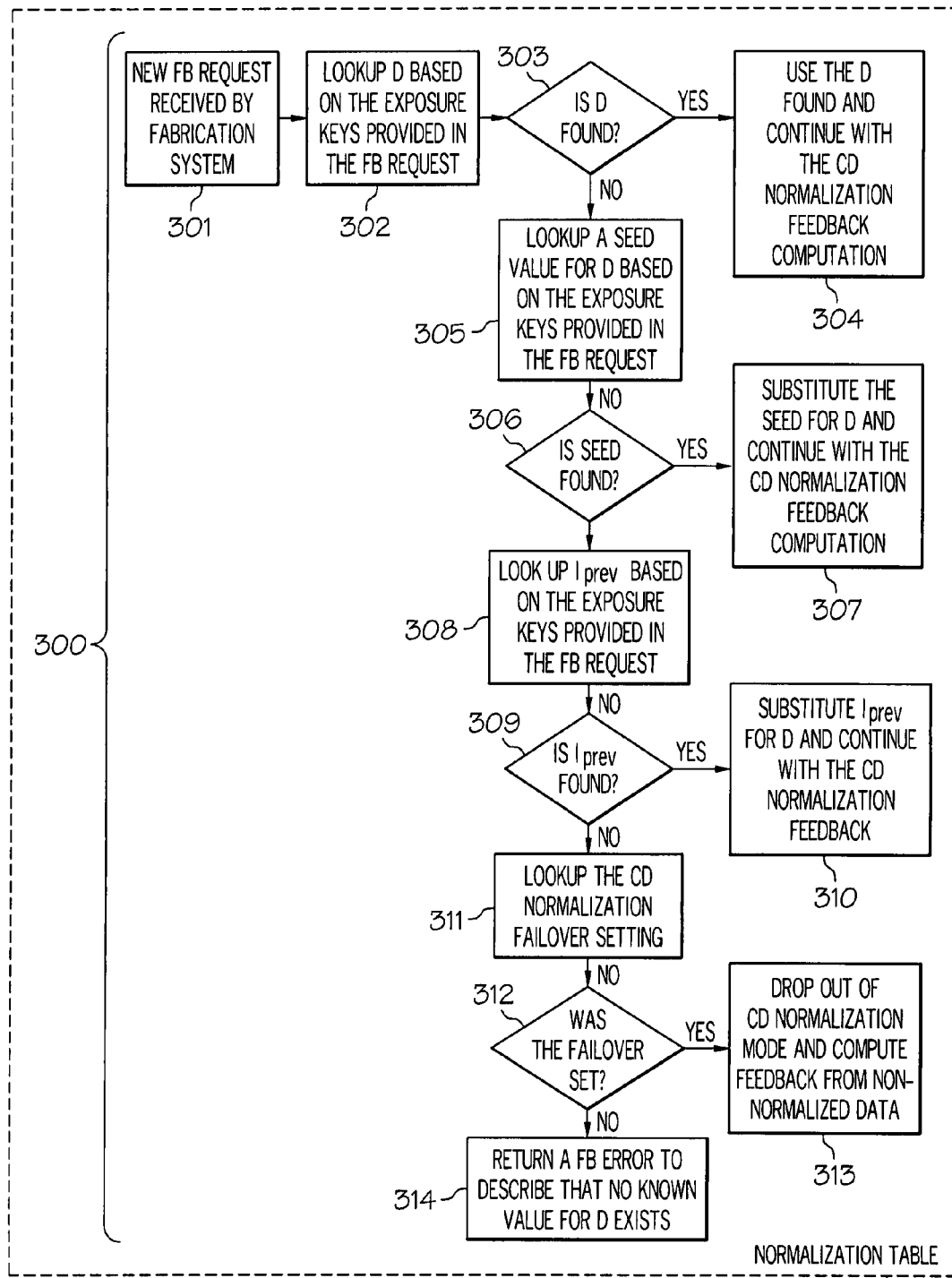
FIG. 3 is a flow chart depicting an exemplary process for maintaining a normalization table for CD normalization.

In FIG. 3, a flowchart depicting an embodiment of the normalization table 283 is provided. In FIG. 3, an exemplary method for querying 300 the normalization table 283 is provided. In the method for querying 300, the fabrication control system 100 receives a request for feedback 301. In response, a lookup 302 of the normalization value D is performed. At a first decision point 303, the method determines if the normalization value D is available in the normalization table 283. If the normalization value D is available in the normalization table 283, then the normalization value D is used for feedback computation 304. If normalization value D is not available, then a seed value is provided 305 using the exposure keys of the request. At a second decision point 306, if the seed is found, then the seed is used for the CD normalization computation 307. If the seed is not found, then another lookup 308 is performed for a previous difference vector, $I_{prev}$. In a third decision point 309, if the previous difference vector, $I_{prev}$, is found, then the previous difference vector, $I_{prev}$, is used for the CD normalization computation 310. If not, yet another lookup is performed, this lookup for a failover setting 311. In a fourth decision point 312, if a failover is set, the control system 100 drops out of CD normalization mode and computes feedback from non-normalized data 313. If the failover has been set, a feedback error is reported 314.

With regard to substituting the seed 307 for the normalization value, D, the seed may be determined in a variety of ways. For example, the seed can be determined from Focus Exposure Matrix (FEM) wafers. In some embodiments, the seed serves as the estimated dose operating point, D, for the first run of new parts (i.e., first silicon). The seed also serves as a starting point for the learning (reference may be had to Eq. (9)).

With regard to substituting the previous difference vector, $I_{prev}$, 310 for the normalization value, D, the previous difference vector, $I_{prev}$, may be based on previous exposure data and metrology events. In some embodiments, the previous difference vector, $I_{prev}$, serves as the estimated dose operating point, D, for the second run of new parts (i.e., second silicon) when the seed is undefined.

With regard to dropping out of CD normalization mode 313, this may occur when the seed is undefined and CD normalization cannot be used for the first run of new parts (i.e., first silicon). By introducing a failover switch, the fabrication control system 100 can drop out of CD normalization mode to compute feedback from non-normalized data. In short, each time a feedback request is received by the fabrication system 1000, a database lookup is performed to identify the normalization value, D, based on the exposure keys provided in the feedback request.

In general, the normalization table 283 provides normalization values, D. The normalization value, D, represents the estimated dose operating point, for each process stream (e.g., device, layer, tool) as defined by exposure keys of the fabrication system 1000. In some embodiments, the normalization value, D, (i.e., the estimated dose operating point) is automatically refined over time. Refinements may occur, for example, according to Eq. (9):

$$D_{prev} = \lambda * D + I_{prev} * (1-\lambda) \qquad \text{Eq. (9)}$$

where:

$D_{prev}$ represents a previous value for the normalization value, D;

$\lambda$ represents a weighting factor; and $I_{prev}$ represents the ideal dose from the previous exposure event.

FIG. 2 provides a method and system for controlling CD error through normalization by providing a normalization table 283 that associates a process system and/or measurement system characteristic such as a photomask and/or exposure tool, to a best-known exposure dose (e.g., "target exposure dose" or "target dose") based on such system parameters, and although the FIG. 2 normalization table 283 may associate a best-known exposure dose with a photomask and/or an exposure tool, those of ordinary skill will recognize that other process system parameters may be associated with a best-known exposure dose. A best-known exposure dose may be understood herein to be associated with an exposure dose that provides a desired and/or target CD error. Other aspects known in the art, including manual input by an operator, may be used in conjunction with the teachings herein.

FIG. 3 is an exemplary embodiment depicting various components to normalization of CD. The order as well as the various steps and alternatives described in FIG. 3 are merely illustrative and are not limiting of the teachings herein.

One skilled in the art will recognize that among the advantages of the present invention, a user (such as a system operator or system engineer) is presented with concise information for system management. For example, a number of control charts may be eliminated while maintaining quality. Consider that system context information determined from one or more high volume runs may be used to assess aspects of low volume runs. In this regard, aspects of control charts are now presented.

As a review, engineers use control charts as statistical tools to determine how much variability in any given process is due to random variation and how much is due to unique events to determine whether a process is in statistical control. Many control charts include three horizontal lines drawn on the chart, such as the one provided in FIG. 4.

Figure 4:
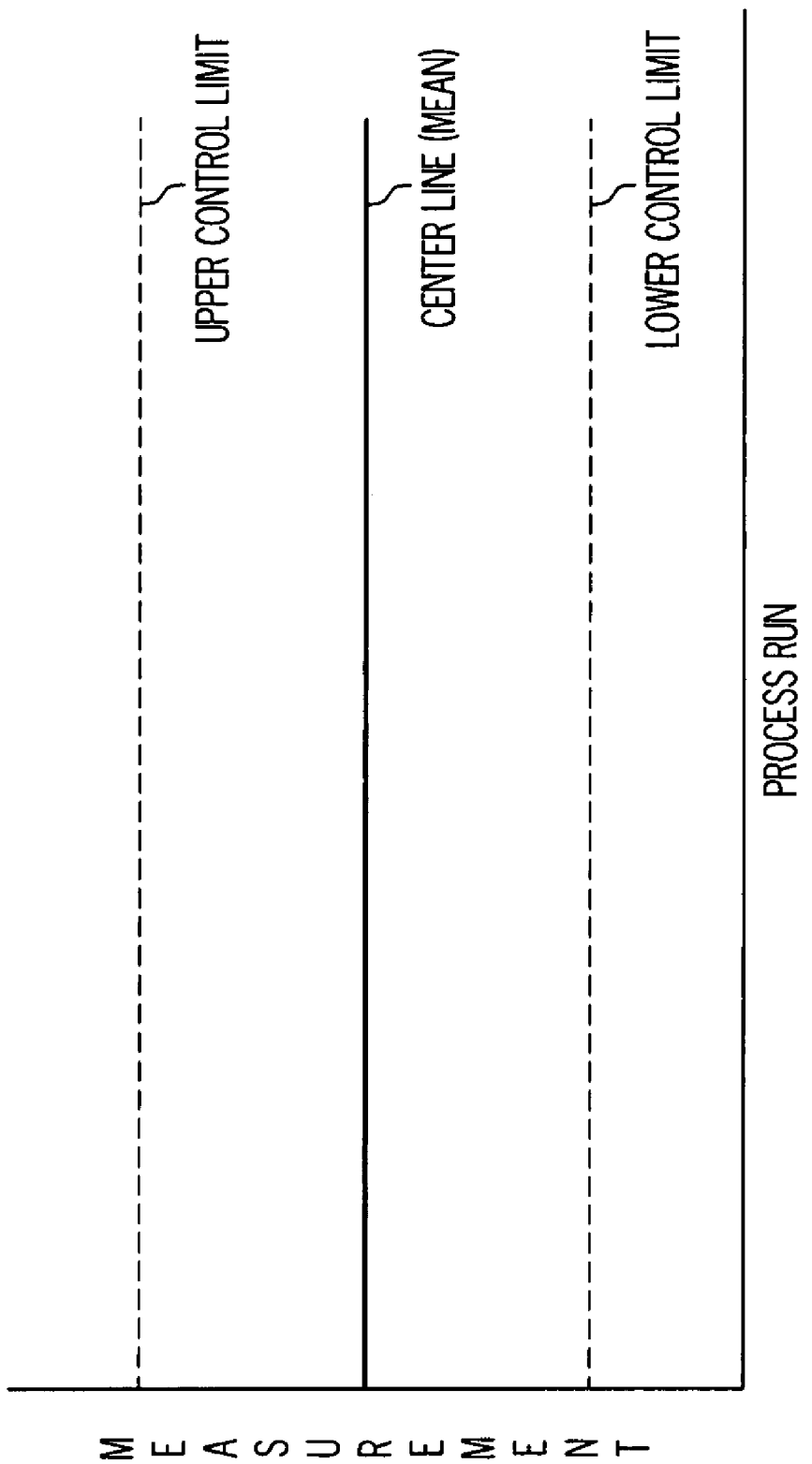
FIG. 4 depicts components of a control chart.

Included in FIG. 4 is a control chart that includes a center line, which represents a mean result for the process, an upper control limit, which is typically drawn at three standard deviations above the center line, and a lower control limit, which is typically drawn at three standard deviations below the center line.

Some control charts include two additional horizontal lines drown between the center line and control lines to serve as upper/lower warning limits. Often times these warning limits are set at +/−2 standard deviations (approximately at the 95% confidence level).

Most often, the control limits are determined by allowing the process to run according to standard manufacturing procedures, without intervening actions that fine tune, or adjust the process for a predetermined number of runs. Once the data is collected an average and standard deviation is computed to draw the center line and limit lines.

Figure 5A:
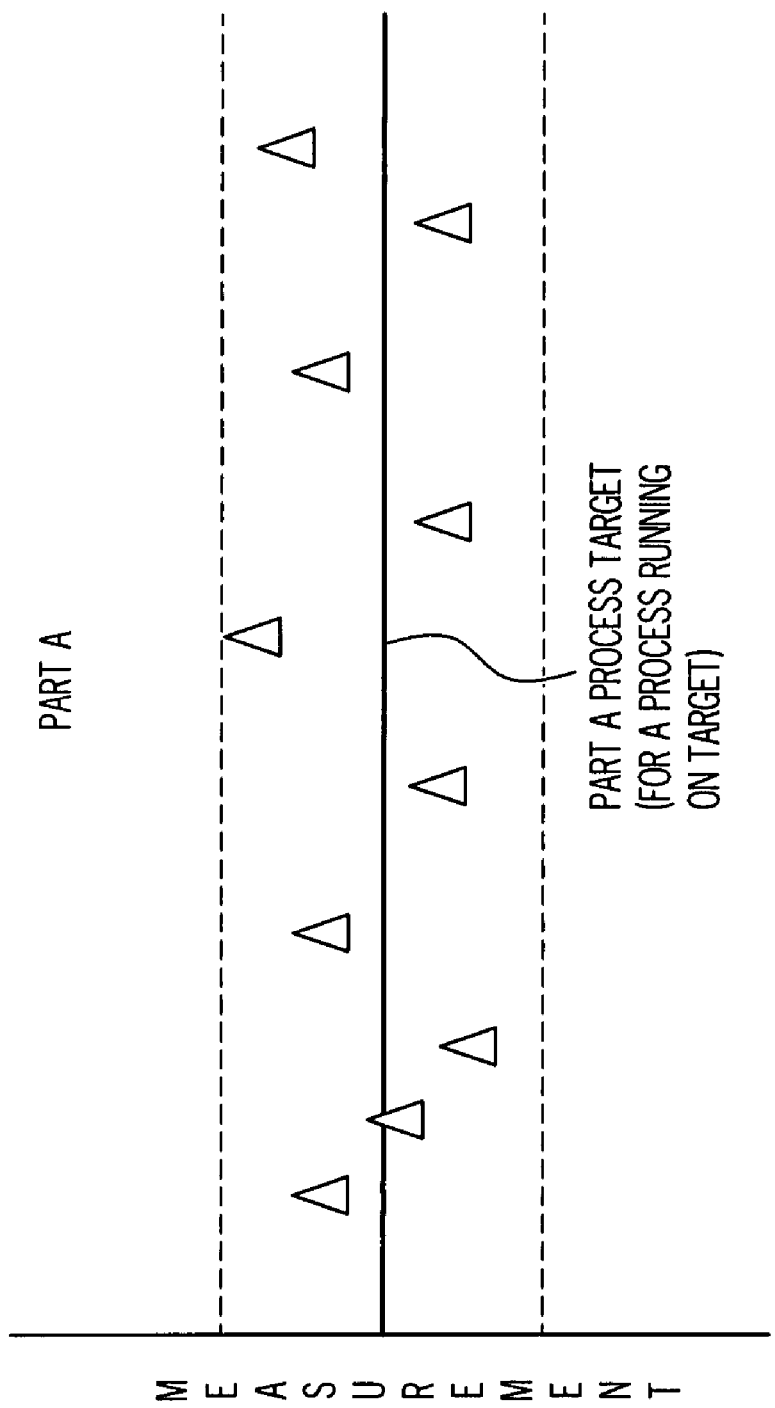
FIG. 5A and FIG. 5B, collectively referred to herein as FIG. 5, depict separate control charts for maintaining control data for two distinct parts.
Figure 5B:
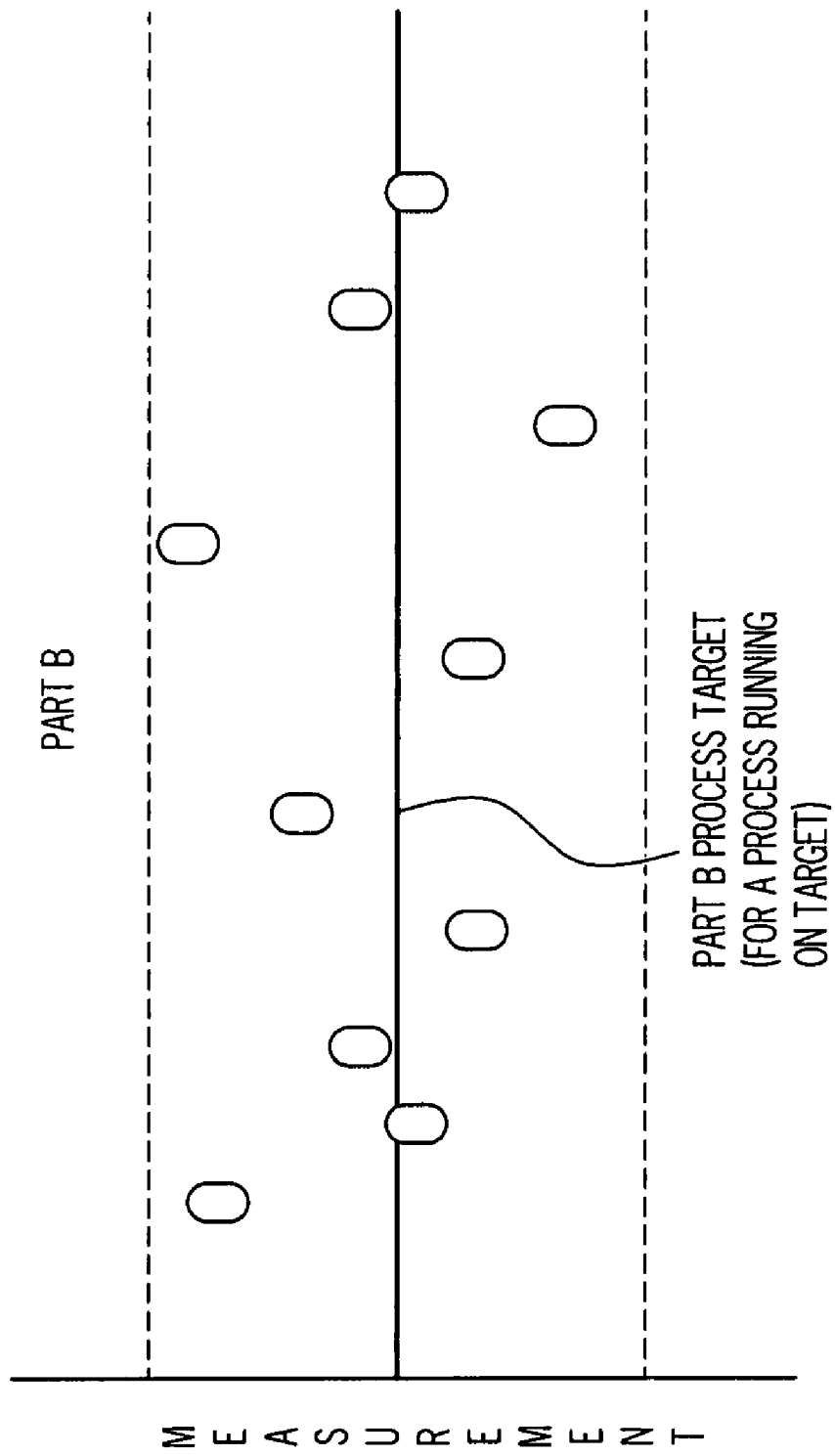

Engineers familiar with process control recognize that when a process is running on target, the center line (mean) will be equal to the process target. Further more, engineers responsible for monitoring and controlling multiple parts (e.g. products) will recognize that each part may have a unique target, as depicted in FIG. 5. One might wish to maintain a control chart for each part for every step of the process that is monitored. For a high volume manufacturing facility this can translate into hundreds, or even thousands of control charts requiring engineering attention.

Figure 6:
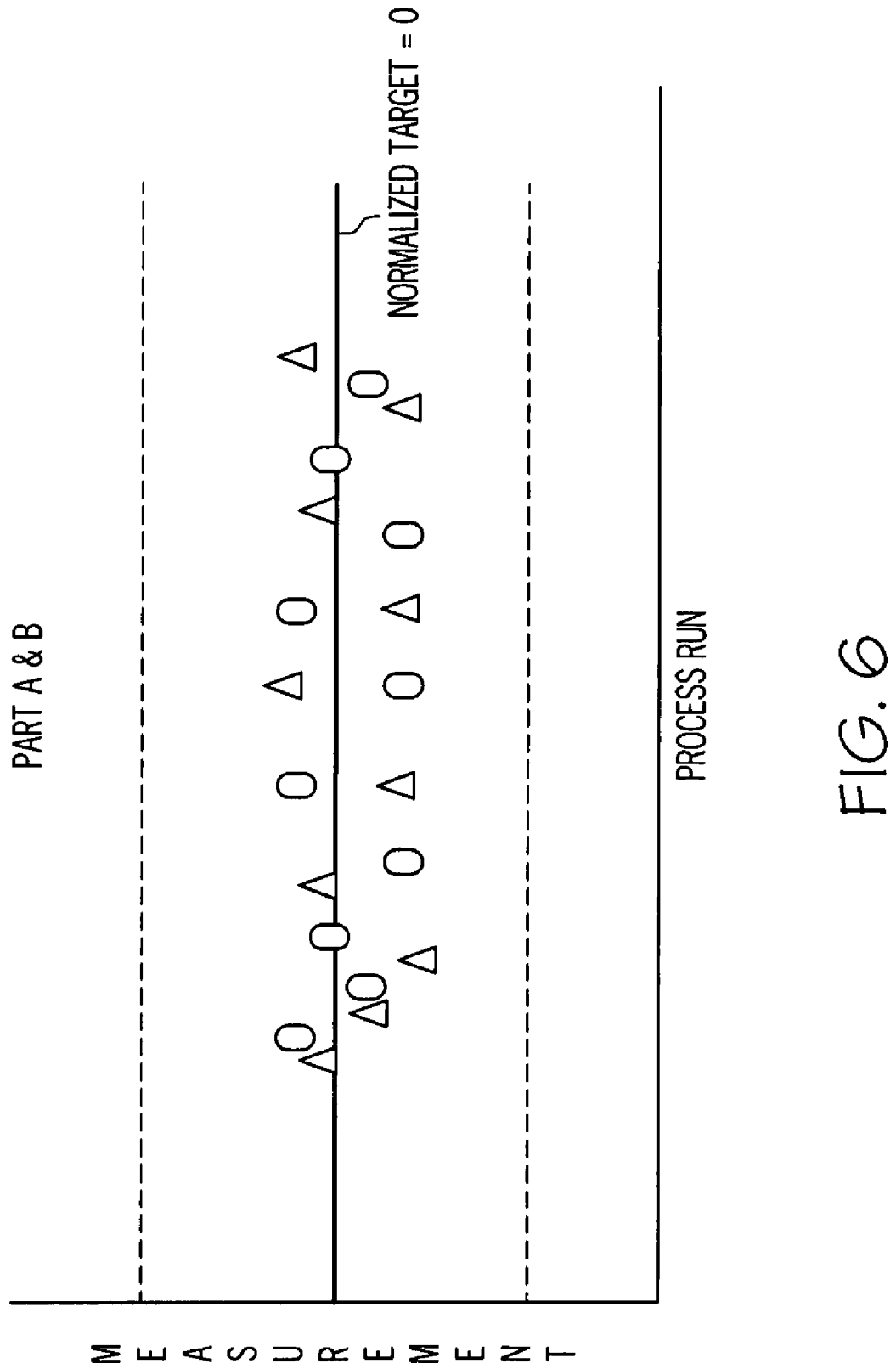
FIG. 6 depicts a single control chart for maintaining the control data for the two distinct part, wherein the control data is plotted as normalized values.

However, the normalized CD deviation determined according to Eq. (2) provides for use of a single control chart to manage control data for multiple parts with different process targets. Reference may be had to FIG. 6. More specifically, through normalization, any given process running on target will have an average value of zero (0) instead of unique non-normalized target value. Accordingly, data for fabrication error associated with various parts may be plotted on a single chart. Advantageously, the fabrication error plotted on the chart may be used to provide for controlling error in other parts. That is, the fabrication error and other information gleened from the control charts may be extrapolated to other parts to reduce, eliminate or otherwise address fabrication and other errors.

What has thus been described are methods and systems for controlling exposure dose error, and hence critical dimension error (CD error) by normalizing measured exposure dose error data based on a best-known or target exposure dose associated with a process system and/or measurement system characteristic. For example, the target dose may be associated with a process level, a photomask, an exposure tool, and/or other process system and/or measurement system characteristic. The target dose may be manually provided, updated based on process system data, and/or based on FEM analysis.

Additional embodiments include a method to compute a normalized critical dimension deviation ($\delta$) from a predetermined target value for the critical dimension, ($CD_T$) and a measured critical dimension ($CD_M$), and a method to compute a normalized dose error ($\epsilon$) for each critical dimension deviation ($\delta$) from a dose sensitivity (DS), the predetermined target value for the critical dimension, ($CD_T$) and the normalization value (D) specific to the part.

Additional embodiments also include a method to compute a normalized actual dose ($\alpha$) from the part specific normalization value (D). Included is the ability to compute a normalized ideal vector ($\iota$) and to collect and weight historical ideal vectors, $\iota$, such that a normalized dose command ($\chi_{FB}$) is computed in a manor that allows different parts to contribute to the calculation.

Further embodiments include a method to convert the normalized dose command, $\chi_{FB}$ to a dose command $C_{FB}$ from the normalization value, D that is specific to the part in process.

Unless otherwise specified, the illustrated embodiments may be understood as providing exemplary features of varying detail of certain embodiments, and therefore, unless otherwise specified, features, components, modules, and/or aspects of the illustrations may be otherwise combined, separated, interchanged, and/or rearranged without departing from the disclosed systems or methods. Additionally, the shapes and sizes of components are also exemplary and unless otherwise specified, may be altered without affecting the disclosed systems or methods.

The methods and systems described herein are not limited to a particular hardware or software configuration, and may find applicability in many computing or processing environments. The methods and systems may be implemented in hardware or software, or a combination of hardware and software. The methods and systems may be implemented in one or more computer programs, where a computer program may be understood to include one or more processor executable instructions. The computer program(s) may execute on one or more programmable processors, and may be stored on one or more storage medium readable by the processor (including volatile and non-volatile memory and/or storage elements), one or more input devices, and/or one or more output devices. The processor thus may access one or more input devices to obtain input data, and may access one or more output devices to communicate output data. The input and/or output devices may include one or more of the following: Random Access Memory (RAM), Redundant Array of Independent Disks (RAID), floppy drive, CD, DVD, magnetic disk, internal hard drive, external hard drive, memory stick, or other storage device capable of being accessed by a processor as provided herein, where such aforementioned examples are not exhaustive, and are for illustration and not limitation.

The computer program(s) may be implemented using one or more high level procedural or object-oriented programming languages to communicate with a computer system; however, the program(s) may be implemented in assembly or machine language, if desired. The language may be compiled or interpreted.

As provided herein, the processor(s) may thus be embedded in one or more devices that may be operated independently or together in a networked environment, where the network may include, for example, a Local Area Network (LAN), wide area network (WAN), and/or may include an intranet and/or the internet and/or another network. The network(s) may be wired or wireless or a combination thereof and may use one or more communications protocols to facilitate communications between the different processors. The processors may be configured for distributed processing and may utilize, in some embodiments, a client-server model as needed. Accordingly, the methods and systems may utilize multiple processors and/or processor devices, and the processor instructions may be divided amongst such single or multiple processor/devices.

The device(s) or computer systems that integrate with the processor(s) may include, for example, a personal computer(s), workstation (e.g., Sun, HP), personal digital assistant (PDA), handheld device such as cellular telephone, laptop, handheld, or another device capable of being integrated with a processor(s) that may operate as provided herein. Accordingly, the devices provided herein are not exhaustive and are provided for illustration and not limitation.

References to "a processor" or "the processor" may be understood to: include one or more processors that may communicate in a stand-alone and/or a distributed environment(s), and may thus may be configured to communicate via wired or wireless communications with other processors, where such one or more processor may be configured to operate on one or more processor-controlled devices that may be similar or different devices. Furthermore, references to memory, unless otherwise specified, may include one or more processor-readable and accessible memory elements and/or components that may be internal to the processor-controlled device, external to the processor-controlled device, and may be accessed via a wired or wireless network using a variety of communications protocols, and unless otherwise specified, may be arranged to include a combination of external and internal memory devices, where such memory may be contiguous and/or partitioned based on the application. Accordingly, references to a database may be understood to include one or more memory associations, where such references may include commercially available database products (e.g., SQL, Informix, Oracle) and also proprietary databases, and may also include other structures for associating memory such as links, queues, graphs, trees, with such structures provided for illustration and not limitation.

As described above, embodiments may be embodied in the form of computer-implemented processes and apparatuses for practicing those processes. In exemplary embodiments, the invention is embodied in computer program code executed by one or more network elements. Embodiments include computer program code containing instructions embodied in tangible media, such as floppy diskettes, CD-ROMs, hard drives, or any other computer-readable storage medium, wherein, when the computer program code is loaded into and executed by a computer, the computer becomes an apparatus for practicing the invention. Embodiments include computer program code, for example, whether stored in a storage medium, loaded into and/or executed by a computer, or transmitted over some transmission medium, such as over electrical wiring or cabling, through fiber optics, or via electromagnetic radiation, wherein, when the computer program code is loaded into and executed by a computer, the computer becomes an apparatus for practicing the invention. When implemented on a general-purpose microprocessor, the computer program code segments configure the microprocessor to create specific logic circuits. Data, instructions and other aspects of the teachings herein may be of at least one of digital form and analog form.

While the invention has been described with reference to exemplary embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims. Moreover, the use of the terms first, second, etc. do not denote any order or importance, but rather the terms first, second, etc. are used to distinguish one element from another. Furthermore, the use of the terms a, an, etc. do not denote a limitation of quantity, but rather denote the presence of at least one of the referenced item.

What is claimed is:

1. A method for controlling error in parts produced using a photolithography fabrication system, the parts comprising different critical dimension target values $CD_T$, the method comprising:
    computing normalized critical dimension deviations ($\delta$) from a predetermined target value for the critical dimension, $CD_T$ and a measured critical dimension ($CD_M$) wherein $\delta=(CD_M/CD_T-1)$;
    combining the normalized critical dimension deviations ($\delta$) in a single dataset;
    computing a normalized dose error ($\epsilon$) for each normalized critical dimension deviation ($\delta$);
    providing a dose correction to minimize critical dimension deviations from the target value, $CD_T$, for subsequent fabrications of parts and;
    continuously updating an estimated dose operating point used in the production of the parts by using a previous estimate of a normalization value (D), a weighting factor ($\lambda$), and a previous ideal dose, the previous ideal dose determined from a previous exposure dose and a dose error.

2. The method as in claim 1, wherein the updating of the estimated dose operating point is based on at least one process system characteristic.

3. The method as in claim 1, where the updating automatically occurs as new process data enters fabrication system.

4. The method as in claim 1, where the updating automatically occurs for a second run of the parts.

* * * * *